(12) United States Patent
Kamano et al.

(10) Patent No.: US 8,750,050 B2
(45) Date of Patent: Jun. 10, 2014

(54) NONVOLATILE SEMICONDUCTOR MEMORY DEVICE AND PROGRAMMING METHOD

(75) Inventors: Shuhei Kamano, Kanagawa (JP); Teruhiro Harada, Tokyo (JP)

(73) Assignee: LAPIS Semiconductor Co., Ltd., Tokyo (JP)

( * ) Notice: Subject to any disclaimer, the term of this patent is extended or adjusted under 35 U.S.C. 154(b) by 78 days.

(21) Appl. No.: 13/616,018

(22) Filed: Sep. 14, 2012

(65) Prior Publication Data

US 2013/0077398 A1 Mar. 28, 2013

(30) Foreign Application Priority Data

Sep. 27, 2011 (JP) .................................. 2011-210551

(51) Int. Cl.
*G11C 16/04* (2006.01)

(52) U.S. Cl.
USPC ............. 365/185.24; 365/185.22; 365/185.23

(58) Field of Classification Search
USPC ............. 365/185.03, 185.09, 185.18, 185.22, 365/185.23, 185.24, 184, 210
See application file for complete search history.

(56) References Cited

U.S. PATENT DOCUMENTS

| 6,963,107 B2 * | 11/2005 | Tomiie et al. ................ 257/324 |
| 7,012,296 B2 * | 3/2006 | Kamigaki et al. ............ 257/316 |
| 7,728,626 B2 * | 6/2010 | Forbes et al. .................. 326/41 |
| 7,924,628 B2 * | 4/2011 | Danon et al. ............ 365/185.28 |

FOREIGN PATENT DOCUMENTS

| JP | 2005-064295 | 3/2005 |
| JP | 2008-085196 | 4/2008 |

OTHER PUBLICATIONS

Boaz Eitan et al., "4-bit per Cell NROM Reliability", IEEE International Electron Devices Meeting (IEDM) Technical Digest; Dec. 5-7, 2005.

* cited by examiner

Primary Examiner — Gene Auduong
(74) Attorney, Agent, or Firm — Studebaker & Brackett PC

(57) ABSTRACT

A nonvolatile semiconductor memory device of the charge trap type is initialized by reading the memory cells in the device to determine which charge traps hold less than a predetermined minimum charge and injecting charge into these charge traps until all of the charge traps in the device hold at least the predetermined minimum charge. The charge traps are then programmed selectively with data. The initialization procedure shortens the programming procedure by narrowing the initial distribution of charge in the charge traps, and leads to more reliable reading of the programmed data.

16 Claims, 8 Drawing Sheets

NONVOLATILE SEMICONDUCTOR MEMORY DEVICE AND PROGRAMMING METHOD

BACKGROUND OF THE INVENTION

1. Field of the Invention

The present invention relates to a nonvolatile semiconductor memory device and its programming method.

2. Description of the Related Art

Nonvolatile semiconductor memory devices with multi-valued memory cells that store more than one bit of data are currently undergoing development. Multi-valued memory can be implemented by a multi-level technique, which uses multiple threshold voltages, a multi-bit technique, in which each memory cell has multiple storage areas, or a combination of both techniques. One type of multi-bit memory cell places two physically noncontiguous silicon nitride sidewall charge traps on opposite sides of the gate electrode in each memory cell. Each charge trap stores one bit of data with a value of '0' or '1', depending on the amount of charge stored in the charge trap. Together, the two charge traps store two bits of data.

In its initial state, with little or no stored charge, a charge trap conventionally represents a '1'. To program the charge trap to the '0' state, positive voltages are applied to the gate electrode and the adjacent main (source or drain) electrode while the other main electrode is grounded. If the gate voltage is sufficiently high, hot electrons are injected into the charge trap and its data value changes to '0'.

To read the data in the charge trap, positive voltages are applied to the gate electrode and the non-adjacent main electrode, the adjacent main electrode is grounded, and the resulting current flow is compared with a threshold current. If there is no stored charge in the charge trap, the current flow exceeds the threshold current, indicating a '1'. If the charge trap has been programmed, the charge of the electrons stored in the charge trap acts counter to the positive gate voltage, reducing the current flow to a value lower than the threshold current, thereby indicating a '0'.

Ideally '0' and '1' data are represented by the same current values in all memory cells, but in practice, process variations and other factors produce cell-to-cell differences that somewhat scatter the current values. The threshold for discrimination between '0' and '1' data must be located in a so-called current window between the range of scatter of the '1' read currents and the range of scatter of '0' read currents. The wider the current window is, the more reliable the discrimination between '0' and '1' becomes.

A two-bit memory cell of the above type is described by Ono in Japanese Patent Application (JP) No. 2005-64295. The same type of memory cell can be made to store four bits of data by programming the charge traps to four different levels of charge, representing data values of '0', '1', '2', and '3', which are read by comparing the read current with three threshold values. The memory cell is programmed as described above except that the '3' state is the initial state, a first gate voltage is used to program a '0', a second, lower gate voltage is used to program a '1', and a third, still lower gate voltage is used to program a '2'.

In 4-*bit per Cell NRM Reliability*, Institute of Electrical and Electronics Engineers (IEEE) International Electron Devices Meeting (IEDM) Technical Digest, IEEE, 2005, Eitan et al. describe a method of programming a charge trap in this type of four-bit memory cell in large and small increments by executing a series of alternating program and verify steps. First the charge trap is programmed with preset drain and gate voltages, and the charge trap is read to verify its read current. If the read current is not yet below the corresponding threshold current, the charge trap is programmed again with a higher drain voltage or gate voltage, and then verified again. These steps are iterated until the read current is below the threshold level, at which point the procedure ends.

In JP 2008-85196, Yuda describes a method of programming a charge trap in this type of four-bit memory cell by programming its two charge traps alternately, so that each program-verify cycle in one charge trap is followed by a program-verify cycle in the other charge trap, unless the programming process in the other charge trap has already been completed. The gate voltages are selected so that the number of program-verify iterations is substantially the same for all charge traps, regardless of whether a '0', '1', or '2' is being programmed. This limits the reduction in the read current value of a charge trap that occurs after its programming has been completed if further programming of the other charge trap in the same memory cell takes place, and ensures that current windows adequate for discrimination among the four data values are maintained.

If the read currents in the initial ('3' data) state are widely scattered, however, as may occur due to process variations and other factors, some memory cells may have unexpectedly high initial read current values. When these memory cells are programmed, many more than the anticipated number of program-verify cycles may be needed to reduce the read current to the necessary level.

If, for example, a '0' is programmed into one charge trap in such a memory cell and a '2' is programmed into the other (mirror) charge trap in the same memory cell, and if the programming of the '2' ends many iterations before the programming of the '0', the continuing '0' program-verify cycles will then reduce the '2' read current and narrow the current window, possibly causing the programmed '2' to be mistakenly read as a '1'. In short, a large scatter in initial read current levels can lead to unreliable reading after the memory device is programmed.

Programming the two charge traps in each memory cell alternately in this way also requires many individual programming operations.

An object of the present invention is to provide a nonvolatile semiconductor memory and programming method that can reduce the number of programming operations necessary in data programming and improve the reliability with which the data are read.

SUMMARY OF THE INVENTION

The invention provides a novel method of programming a nonvolatile semiconductor memory device including a plurality of bit lines and a plurality of memory cells connected to the bit lines. The memory cells include respective charge traps for storing charge representing data values. The method starts by reading the memory cells to determine which charge traps hold less than a predetermined minimum charge. Next, the method injects charge into the charge traps holding less than the predetermined minimum charge until all of the charge traps hold at least the predetermined minimum charge, thereby placing the memory cells in an initial state. After the memory cells have been placed in the initial state, they are programmed by selectively injecting charge into their charge traps via the bit lines.

The invention also provides a nonvolatile semiconductor memory device including a plurality of bit lines, a plurality of memory cells connected to the bit lines, and a controller. The memory cells have respective charge traps for storing charge representing data values. The controller programs the memory cells by the novel method described above.

The memory cells may be read by detecting read current drawn on the bit lines. Before charge is injected to place the memory cells in the initial state, a pair of charge traps adjacent to the same bit line may be read together, and when charge is injected to place the memory cells in the initial state, charge may be injected simultaneously into the pair of charge traps.

In the initial state, since all charge traps hold at least the minimum charge, the distribution of their initial charges is narrower than it was before initialization. This enables the subsequent programming of data to be carried out in a comparatively uniform manner in all memory cells. In particular, no memory cells require an inordinately high number of programming operations. The number of programming operations is thereby reduced, and the reliability of the programmed data is improved.

DETAILED DESCRIPTION OF THE INVENTION

Figure 1:
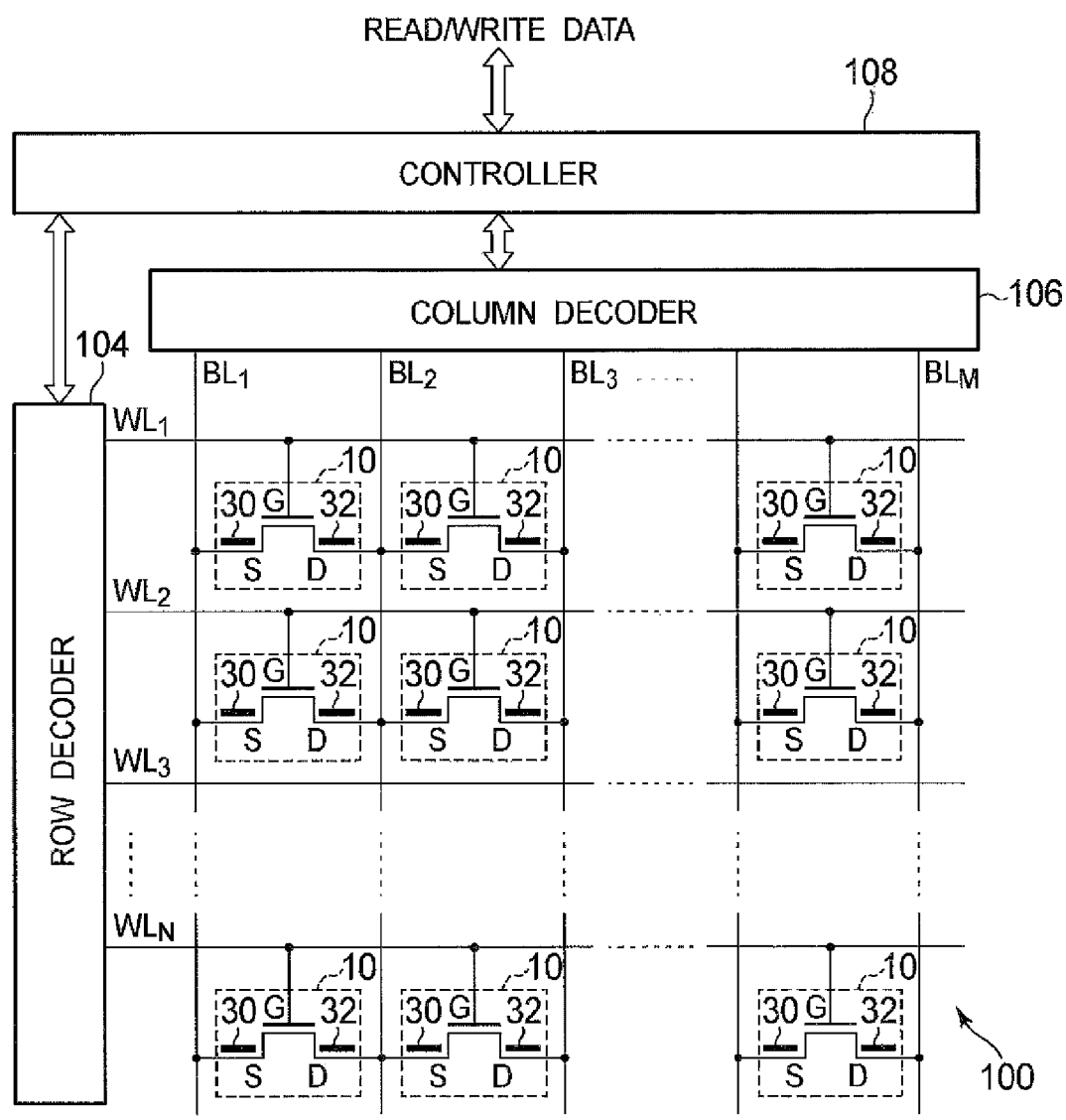
FIG. 1 schematically illustrates the internal structure of a semiconductor nonvolatile memory device in an embodiment of the invention.

An embodiment of the invention will now be described with reference to the attached drawings, in which like elements are indicated by like reference characters.

Referring to FIG. 1, the embodiment is a nonvolatile semiconductor memory device including a memory cell array 100, a row decoder 104, a column decoder 106, and a controller 108. The controller 108 is a computing device with its own internally stored program for carrying out the novel initialization and programming procedure described below.

The memory cell array 100 includes a plurality of bit lines $BL_1$ to $BL_M$ (M being an integer equal to or greater than two) arranged in columns, and a plurality of word lines $WL_1$ to $WL_N$ (N being integer equal to or greater than two) arranged in rows intersecting the columns. Where it is not necessary to identify individual bit and word lines, BL will be used to denote an arbitrary bit line and WL to denote an arbitrary word line. A memory cell 10 is disposed at each intersection of a bit line BL and word line WL. The memory cell 10 is configured as, for example, an n-channel metal-oxide-semiconductor field-effect transistor (MOSFET).

Each memory cell 10 includes a charge trap 30 disposed on the source (S) side of the gate electrode (G) and a charge trap 32 disposed on the drain (D) side of the gate electrode (G). Each charge trap can store any one of four data values, designated '0', '1', '2', and '3'.

Figure 2:
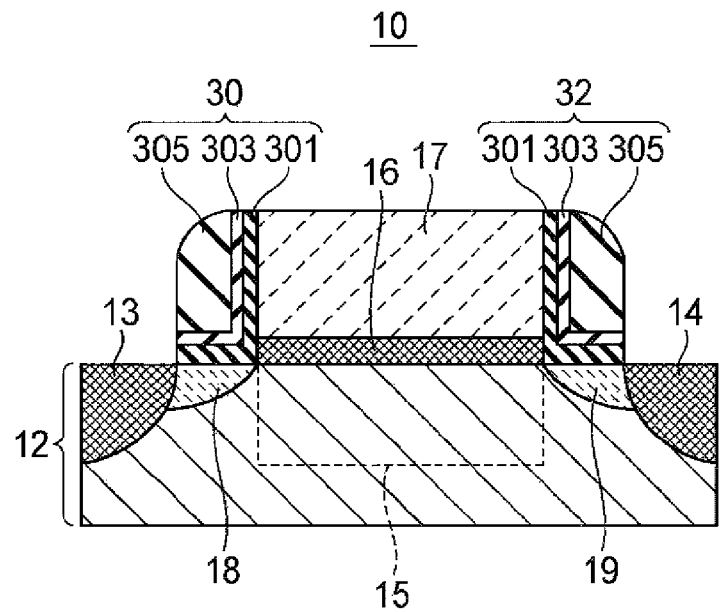
FIG. 2 is a sectional view showing the structure of a memory cell in FIG. 1.

Referring to the sectional view in FIG. 2, each memory cell 10 is formed in the upper surface of a p-type silicon substrate 12. A gate electrode 17 made of polycrystalline silicon (polysilicon) is formed on a silicon oxide ($SiO_2$) gate oxide film 16 that covers a channel region 15 in the p-type substrate. The gate electrode 17 is connected to a word line WL as shown in FIG. 1. A source region 13 and drain region 14, both including a high concentration of an n-type impurity, are formed in the surface of the p-type silicon substrate 12 on opposite sides of the gate electrode 17. The source region 13 and the drain region 14 are connected to two different bit lines BL as shown in FIG. 1. During the MOSFET operation, a conductive channel forms between the source and drain regions 13, 14 in the channel region 15, just under the gate electrode 17. Extension regions 18, 19 including a relatively low concentration of an n-type impurity are formed in the upper surface of the silicon substrate 12 between the channel region 15 and the source region 13 and between the channel region 15 and drain region 14, respectively. The purpose of the extension regions 18, 19 is efficient injection of charge into the charge traps 30, 32. Charge trap 30 is located above the source-side extension region 18. Charge trap 32 is located above the drain-side extension region 19. The charge traps 30 and 32 are layered dielectric films with an oxide-nitride-oxide (ONO) structure, including a silicon-oxide film 301, a silicon-nitride film 303, and a silicon-oxide film 305. These films are formed in successive layers on the extension regions 18 and 19, each film further extending up the adjacent side of the gate electrode 17. This structure provides a stable charge trapping function.

Source and drain designations are given in the above description only for convenience. During the operation of the memory device the roles of source and drain are interchangeable. In some memory cells 10 charge trap 30 may be the source-side charge trap and charge trap 32 the drain-side charge trap while in other memory cells charge trap 30 is the drain-side charge trap and charge trap 32 the source-side charge trap.

The two charge traps 30, 32 are physically noncontiguous and are located at a distance from each other, enabling separate storage of charge. Data values from '0' to '3' are stored in each of the charge traps 30 and 32, depending on the amount of charge present in each charge trap. The amount of stored charge is equal to or greater than a first threshold charge when the stored data value is '0', is between the first threshold charge and a lower second threshold charge when the stored data value is '1', is between the second threshold charge and a still lower third threshold charge when the stored data value is '2', and is between than the third threshold charge and the initial minimum charge when the stored data value is '3'. The amount of charge originally present in each charge trap 30, 32 in the memory cell 10 is less than the third threshold charge and may be less than the initial minimum charge.

With this structure, the four data values '0' to '3' are programmed and read according to voltages applied to the gate electrode via the relevant word line WL and to the source and drain regions via the relevant pair of bit lines BL.

The row decoder 104 applies a programming voltage or a scan voltage to a selected one of the word lines $WL_1$ to $WL_N$ in the memory cell array 100 according to control signals received from the controller 108.

The column decoder 106 applies the ground potential, a read voltage, or a write voltage to the bit lines $BL_1$ to $BL_M$ in the memory cell array 100 according to control signals received from the controller 108. When a bit line BL is grounded and the read voltage is applied to one or both of the adjacent bit lines, the column decoder 106 sends the controller 108 a signal representing the magnitude of the resulting current drawn through the grounded bit line BL, thus indicating the amount of charge stored in one or both of the charge traps 30, 32 adjacent to the grounded bit line BL in the memory cells 10 connected to bit line BL and the selected word line WL.

When the controller 108 receives four-valued data to be programmed into all of the memory cells 10 in the memory cell array 100, it executes the following programming procedure.

Figure 3:
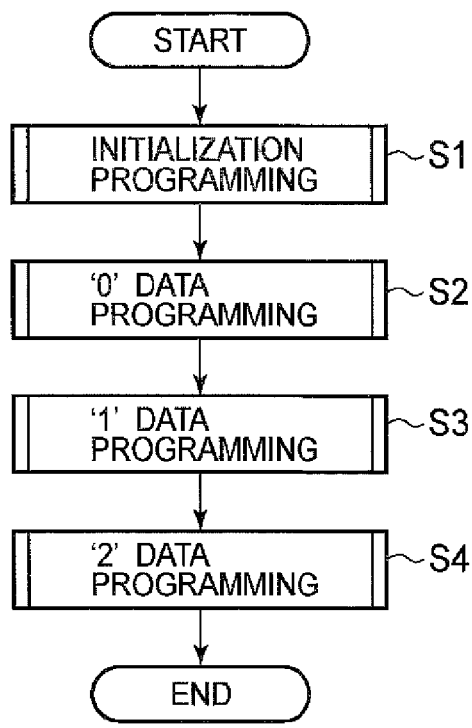
FIG. 3 is a flowchart illustrating a procedure for programming the semiconductor nonvolatile memory device.

Referring to the flowchart in FIG. 3, first the controller 108 executes an initialization programming routine to initialize the amount of charge stored in the charge traps 30 and 32 in all the memory cells 10 in the memory cell array 100 (step S1).

Figure 4:
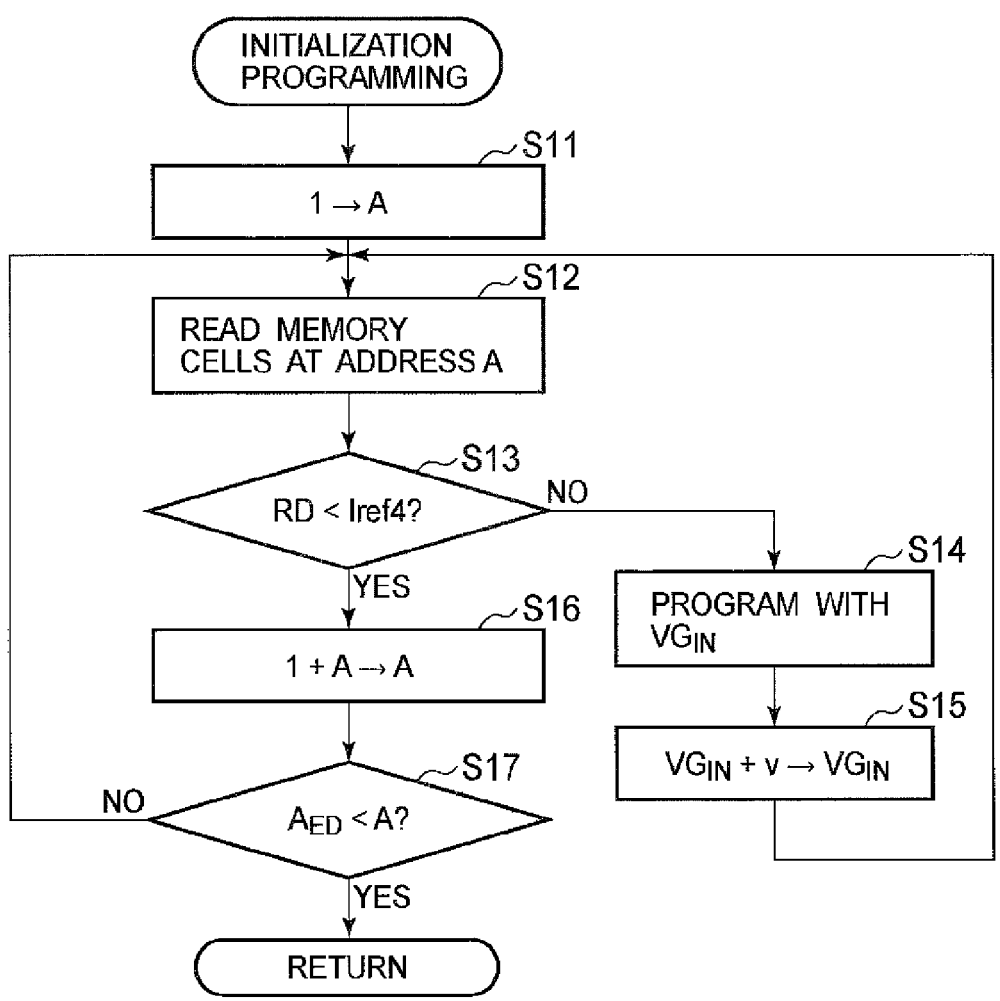
FIG. 4 is a flowchart illustrating an initialization programming routine.

Referring to FIG. 4, in the initialization programming routine, first the controller 108 stores the value '1', representing the lowest row address in the memory cell array, in an internal access address register (not shown) as an access address A (step S11).

Next, the controller 108 supplies the row and column decoders 104, 106 with control signals to read the data from the memory cells in the row designated by access address A (step S12). In this step, first the row decoder 104 supplies the scan voltage VS to the word line WL at address A while the column decoder supplies the ground potential (0 volts) to the odd-numbered bit lines $BL_1$, $BL_3$, ... and the read voltage VR to the even-numbered bit lines $BL_2$, $BL_4$, .... Next, while the row decoder 104 holds the word line WL at the scan voltage VS, the column decoder 106 applies the ground potential (0 volts) to the even-numbered bit lines $BL_2$, $BL_4$, ... and the read voltage VR to the odd-numbered bit lines $BL_1$, $BL_3$, .... These operations draw read currents $RD_1$ to $RD_M$ through the grounded bit lines $BL_1$ to $BL_M$. The characters RD will be used to denote an arbitrary one of the read currents $RD_1$ to $RD_M$. Each read current RD indicates the amount of charge stored in the pair of charge traps 30 and 32 adjacent to the corresponding bit line BL in the memory cells 10 connected to word line WL. As the amount of stored charge increases, the read current RD decreases. The read current values $RD_1$ to $RD_M$ are reported to the controller 108.

Next, the controller 108 determines whether or not all the read currents $RD_1$ to $RD_M$ are less than an initialization threshold current Iref4 (step S13). The initialization threshold current Iref4 is the read current produced by charge traps holding the initial minimum charge $Q_{MIN}$. A read current RD greater than the initialization threshold current Iref4 indicates that the corresponding charge traps 30, 32 have less than the initial minimum charge $Q_{MIN}$. The initialization threshold current Iref4 is greater than the data threshold currents Iref1, Iref1, Iref3 used to discriminate among the '0', '1', '2', and '3' data values when data are read.

Figure 5:
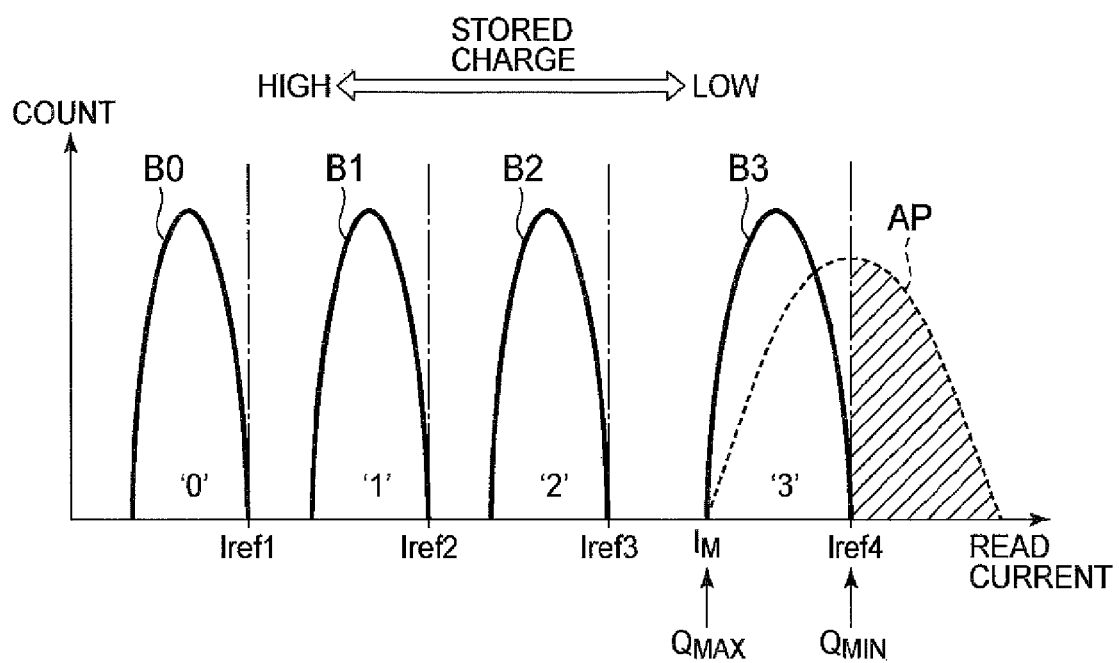
FIG. 5 is a histogram showing read current distributions before and after initialization and after the programming of data.

The threshold currents Iref1, Iref2, Iref3, Iref4 are shown in FIG. 5. These threshold currents are generated by respective reference current sources (not shown).

When it is decided in step S13 that one or more of the read currents $RD_1$ to $RD_M$ are equal to or greater than Iref4, the controller 108 proceeds to step S14. In step S14, the controller 108 sends the row and column decoders 104, 106 control signals to execute a programming operation using a preset initialization programming voltage $VG_{IN}$ in the memory cells 10 that produced read currents RD higher than threshold Iref4. The row decoder 104 applies the initialization programming voltage $VG_{IN}$ to the word line WL at address A. The column decoder 106 applies the write voltage VW to a bit line BL that produced a read current RD greater than the initialization threshold current and applies the ground potential (0 volt) to the other bit lines, thereby injecting additional charge into the pair of charge traps 30, 32 adjacent to bit line BL in row A. If more than one read current RD was equal to or greater than the initialization threshold current Iref4, this procedure is repeated the necessary number of times to inject additional charge into each of the corresponding charge traps.

Alternatively, if sufficient programming current is available, charge may be injected into two or more pairs of charge traps simultaneously by applying the write voltage VW to two or more non-adjacent bit lines simultaneously. For example, the write voltage VW may be applied simultaneously to all the odd-numbered bit lines that produced read currents equal to or greater than Iref4, then simultaneously to all the even-numbered bit lines that produced read currents equal to or greater than Iref4. In each case, the bit lines to which the write voltage VW is not applied are grounded.

After executing step S14, the controller 108 adds a voltage increment v to the initialization programming voltage $VG_{IN}$ and sets the resulting value as a new initialization programming voltage $VG_{IN}$ (step S15). After step S15, the controller 108 returns to step S12 and repeats the above process.

Steps S12 to S15 form a loop that repeatedly verifies the amounts of charge in all the charge traps 30, 32 in row A by comparing their read currents $RD_1$ to $RD_M$ with the initialization threshold current Iref4 and injects additional charge into the charge traps that produce read currents equal to or greater than Iref4. The initialization process exits this loop when the controller 108 decides in step S13 that all the read currents $RD_1$ to $RD_M$ are less than the initialization threshold current Iref4, that is, when all the charge traps 30, 32 in row A hold at least the initial minimum charge $Q_{MIN}$.

More precisely, since pairs of mutually adjacent charge traps are read together, steps S12 to S15 ensure that the mean value of the charge stored in each such pair of charge traps is at least $Q_{MIN}$. Since mutually adjacent charge traps tend to have similar characteristics, however, the individual charge traps will all have stored charge values of substantially $Q_{MIN}$ or greater.

When the controller 108 decides in step S13 that all the read currents $RD_1$ to $RD_M$ are less than the initialization threshold current Iref4, it increments the access address A by one (1) and stores the resulting value as a new access address A in the access address register, overwriting the previous value (step S16). After step S16, the controller 108 decides whether or not the new access address A is higher than an end address $A_{ED}$, which is the highest row address in the memory cell array 100 (step S17). If the access address A is not higher than the end address $A_{ED}$, the process returns to step S12. Steps S12 to S17 are iterated until the access address A exceeds the end address $A_{ED}$ in step S17, at which point the initialization programming routine is finished and the controller 108 returns to the next step in the programming procedure shown in FIG. 3.

Execution of the initialization programming routine brings all the charge traps 30, 32 in the memory cell array 100 into an initial state such that their stored charge produces a read current lower than the initialization threshold Iref4. Before the initialization programming routine, the read currents of the memory cells 10 are typically distributed both above and below the initialization threshold current Iref4, as indicated by line AP in FIG. 5. Execution of the initialization programming routine compresses the distribution from AP to a distribution, shown conceptually by line B3, in which no read current value is greater than the initialization threshold current Iref4 and each charge trap stores at least the desired initial minimum charge $Q_{MIN}$. Both distributions AP and B3 have substantially the same minimum read current corresponding to an initial maximum stored charge $Q_{MAX}$.

This minimum read current $I_M$ is greater than the threshold current Iref3 used to distinguish between stored data values of '2' and '3'. In the initialized state following the initialization programming routine, accordingly, the entire memory cell array 100 stores data with the value '3'.

After executing the initialization programming routine (step S1 in FIG. 3), the controller 108 executes a '0' programming routine (step S2 in FIG. 3) on the charge traps into which '0' data are to be stored. This data value ('0') corresponds to the highest stored charge and the lowest read current. The '0' programming routine will be described with reference to the flowchart in FIG. 6.

Figure 6:
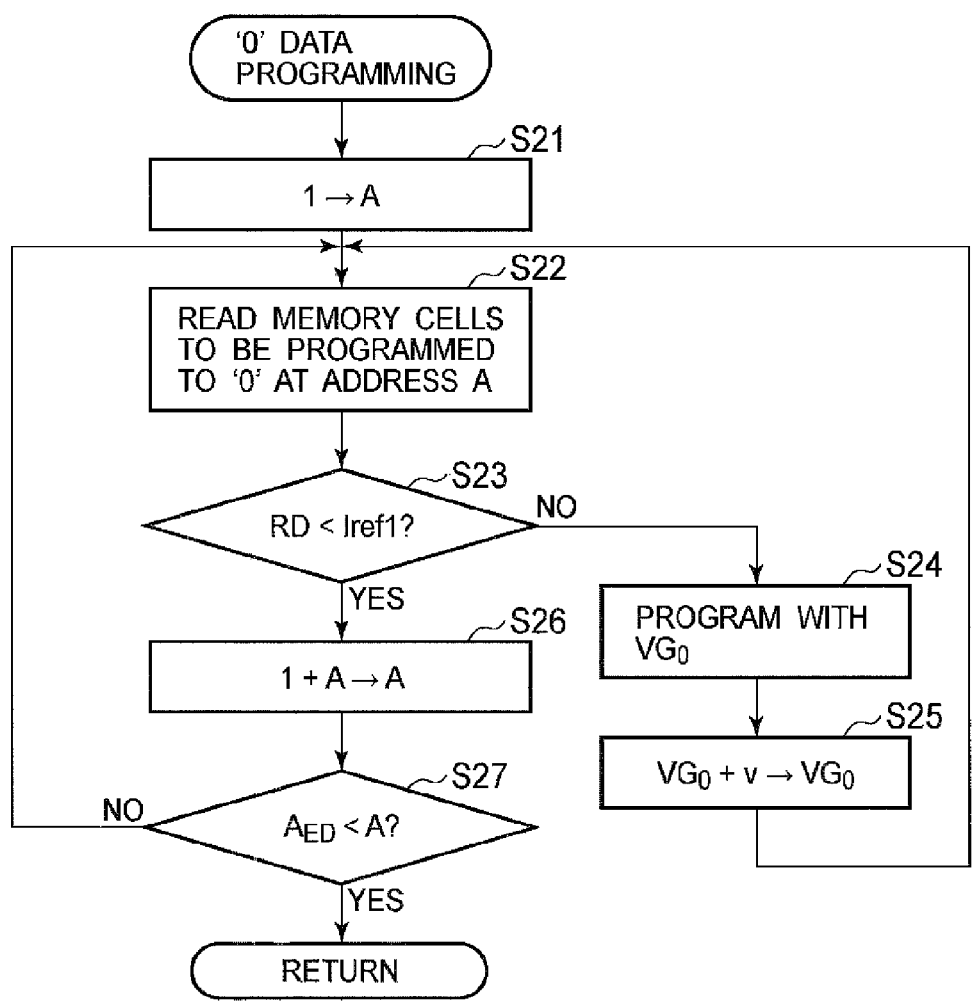
FIGS. 6, 7, and 8 are flowcharts illustrating routines for programming '0', '1', and '2' data.

First, the controller 108 stores '1' as an initial access address A in its access address register (step S21 in FIG. 6).

Next, the controller 108 supplies the row and column decoders 104, 106 with control signals for reading data from the charge traps 30, 32 in row A that are to be programmed with '0' data (step S22). The row decoder 104 applies the scan voltage VS to the word line WL at address A. To read a particular charge trap adjacent to a bit line BL, the column decoder 106 applies the ground potential (0 volts) to this bit line BL and one adjacent bit line, and applies the read voltage VR to the other adjacent bit line. This procedure may be repeated once for each charge trap to be programmed with '0' data. Alternatively, read current may be obtained from a plurality of charge traps simultaneously. In one scheme, first the ground potential is applied to bit lines $BL_{4N+1}$, $BL_{4N+2}$ and the read voltage to bit lines $BL_{4N+3}$, $BL_{4N+4}$ (N=0, 1, ..., M/4); then the ground potential is applied to bit lines $BL_{4N+2}$, $BL_{4N+3}$ and the read voltage to bit lines $BL_{4N+4}$, $BL3_{4N+1}$; then the ground potential is applied to bit lines $BL_{4N+3}$, $BL_{4N+4}$ and the read voltage to bit lines $BL_{4N+1}$, $BL3_{4N+2}$; then the ground potential is applied to bit lines $BL_{4N+4}$, $BL_{4N+1}$ and the read voltage to bit lines $BL_{4N+2}$, $BL_{4N+3}$. This scheme reads M/2 individual charge traps at a time, enabling all 2M charge traps in row A to be read in just four operations.

Next, in step S23, the controller 108 decides whether all the read currents RD obtained in step S22 from charge traps to be programmed to '0' are less than the threshold current Iref1 for distinguishing between '0' and '1' data (see FIG. 5).

When it is decided in step S23 that one or more of the charge traps to be programmed to '0' in row A require further charge injection because the read current RD they produced in step S22 is equal to or greater than Iref1, the controller 108 proceeds to step S24. In step S24, the controller 108 sends the row and column decoders 104, 106 control signals to execute a programming operation on the charge traps requiring charge injection in row A. The row decoder 104 applies a preset programming voltage $VG_0$ to the word line WL at address A. To program a particular charge trap adjacent to a bit line BL in row A, the column decoder 106 applies the write voltage VW to bit line BL and all the bit lines on one side of bit line BL and applies the ground potential (0 volts) to all the bit lines on the other side of bit line BL, thereby injecting charge into the intended charge trap without injecting charge into other charge traps. This procedure may be repeated once for each charge trap that requires charge injection. Alternatively, depending on the locations of the charge traps requiring charge injection, a plurality of charge traps may be programmed simultaneously, provided sufficient programming current is available.

After injecting charge into all the necessary charge traps in step S24, the controller 108 adds a voltage increment v to the programming voltage $VG_0$ and sets the resulting value as a new programming voltage $VG_0$ (step S25). After step S25, the controller 108 returns to step S22 and repeats the above process.

Steps S22 to S25 form a loop that programs the charge traps 30, 32 that are to be programmed to '0'. The programming proceeds in stepwise increments, with gradually increasing programming voltages $VG_0$, until all these charge traps 30, 32 produce read currents RD less than threshold Iref1, that is, until '0' data are actually stored in all these charge traps.

When the controller 108 decides in step S23 that all the read currents RD produced by charge traps that are to be programmed to '0' are less than read current threshold Iref1, it increments the access address A by one (step S26) and decides whether or not the new access address A is greater than the end address $A_{ED}$ (step S27). If access address A is not higher than the end address $A_{ED}$, the process returns to step S22. Steps S22 to S27 are iterated until the access address A exceeds the end address $A_{ED}$ in step S27, at which point the '0' programming routine is finished and the controller 108 returns to the next step in the programming procedure shown in FIG. 3.

Execution of the '0' programming routine brings all the charge traps 30, 32 that are to be programmed with '0' data into states that produce read currents lower than the threshold current Iref1 for distinguishing between '0' and '1' data. The distribution of read currents produced by these charge traps is thereby shifted from the distribution indicated by line B3 to the distribution indicated by line B0 in FIG. 5.

Since distribution B3 is comparatively narrow, all of these charge traps can be programmed to '0' in substantially the same number of iterations of steps S22 to S25. If the charge traps had been left with their original charge distribution AP, some charge traps would require more iterations.

After executing the '0' programming routine (step S2 in FIG. 3), the controller 108 executes a '1' programming routine (step S2 in FIG. 3) on the charge traps into which '1' data are to be stored. The '1' programming routine will be described with reference to the flowchart in FIG. 7.

Figure 7:
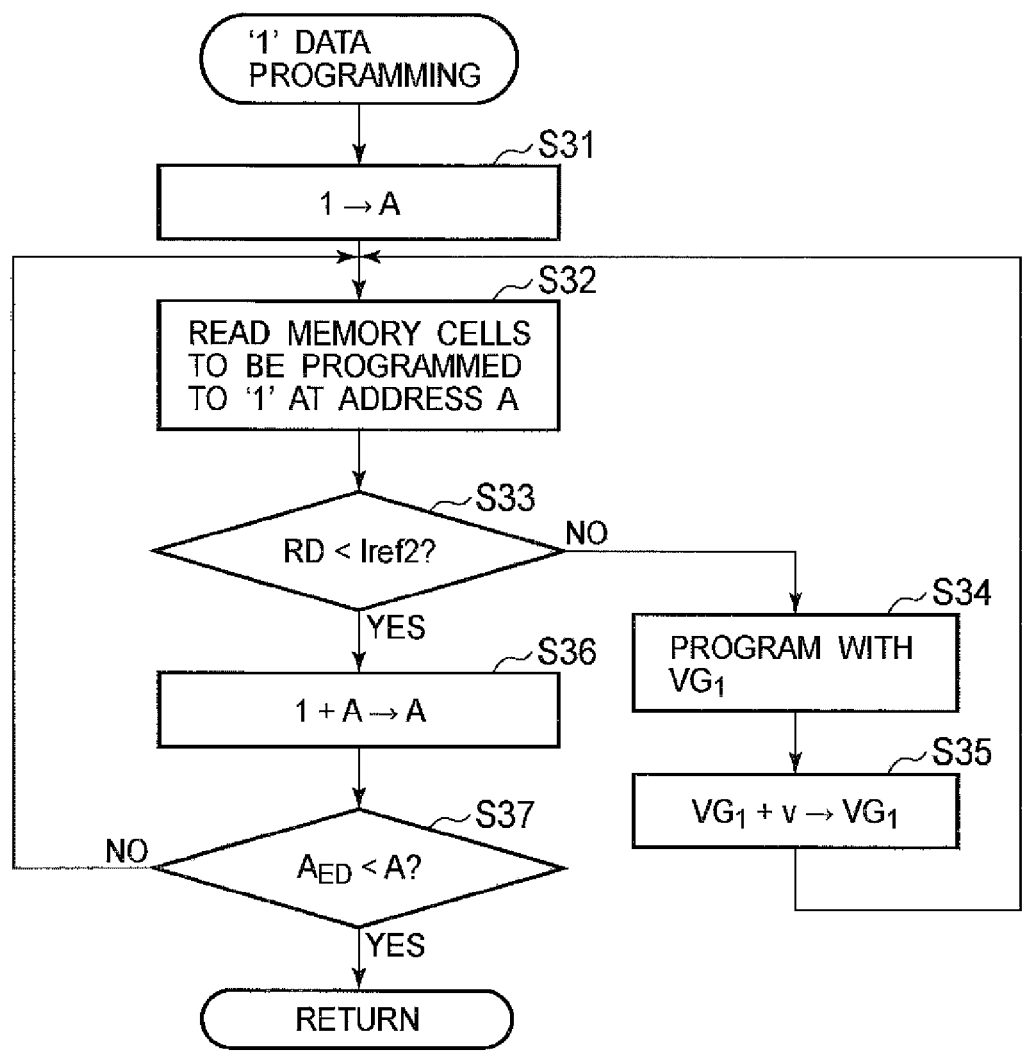

First, the controller 108 stores '1' as the address A in its access address register (step S31 in FIG. 7).

Next, the controller 108 supplies the row and column decoders 104, 106 with control signals for reading data from the charge traps 30, 32 in row A that are to be programmed with '1' data (step S32). This step is similar to step S22 in the '0' data programming procedure, and uses the same scan voltage VS and read voltage VR.

Next, in step S33, the controller 108 decides whether all the read currents RD obtained in step S32 from charge traps to be programmed to '1' are less than the threshold current Iref2 shown in FIG. 5 for distinguishing between '1' and '2' data.

When it is decided in step S33 that one or more of the charge traps to be programmed to '1' in row A require further charge injection because the read current RD they produced in step S32 is equal to or greater than Iref2, the controller 108 proceeds to step S34. In step S34, the controller 108 sends the row and column decoders 104, 106 control signals to execute a programming operation on the charge traps requiring charge injection in row A. The row decoder 104 applies a preset gate voltage $VG_1$, which is lower than the gate voltage $VG_0$ used for programming '0' data, to the word line WL at address A. The column decoder 106 applies the write voltage VW and ground potential (0 volts) to the bit lines BL to inject charge into the necessary charge traps as described in step S24 of the '0' data programming procedure.

After injecting charge into all the necessary charge traps in step S34, the controller 108 adds a voltage increment v to the programming voltage $VG_1$ and sets the resulting value as a new programming voltage $VG_1$ (step S35), then returns to step S32 and repeats the above process.

Steps S32 to S35 form a loop that programs the charge traps 30, 32 that are to be programmed to '1'. The programming proceeds in stepwise increments, with gradually increasing programming voltages $VG_1$, until all these charge traps 30, 32 produce read currents RD less than threshold current Iref2, that is, until '1' data are actually stored in all these charge traps.

When the controller 108 decides in step S33 that all the read currents RD produced by charge traps that are to be programmed to '1' are less than threshold current Iref1, it increments the access address A by one (step S36), tests the new access address A (step S37), and returns to step S32 if the access address A is not higher than the end address $A_{ED}$. Steps S32 to S37 are iterated until the access address A exceeds the end address $A_{ED}$ in step S37, at which point the '1' programming routine is finished, and the controller 108 returns to the next step in the programming procedure shown in FIG. 3.

Execution of the '1' programming routine brings all the charge traps 30, 32 that are to be programmed with '1' data into states that produce read currents lower than the threshold current Iref2 for distinguishing between '1' and '2' data. The distribution of read currents produced by these charge traps is thereby shifted from the distribution indicated by line B3 in FIG. 5 to the distribution indicated by line B1, located between the threshold Iref2 for distinguishing between '1' and '2' data and the threshold Iref1 for distinguishing between '0' and '1' data.

Since distribution B3 is comparatively narrow, all of these charge traps can be programmed to '1' in substantially the same number of iterations of steps S32 to S35. If the charge traps had been left with their original distribution AP, some charge traps would require more iterations.

After executing the '1' programming routine (step S3 in FIG. 3), the controller 108 executes a '2' programming routine (step S4 in FIG. 3) on the charge traps into which '2' data are to be stored. The '2' programming routine will be described with reference to the flowchart in FIG. 8.

Figure 8:
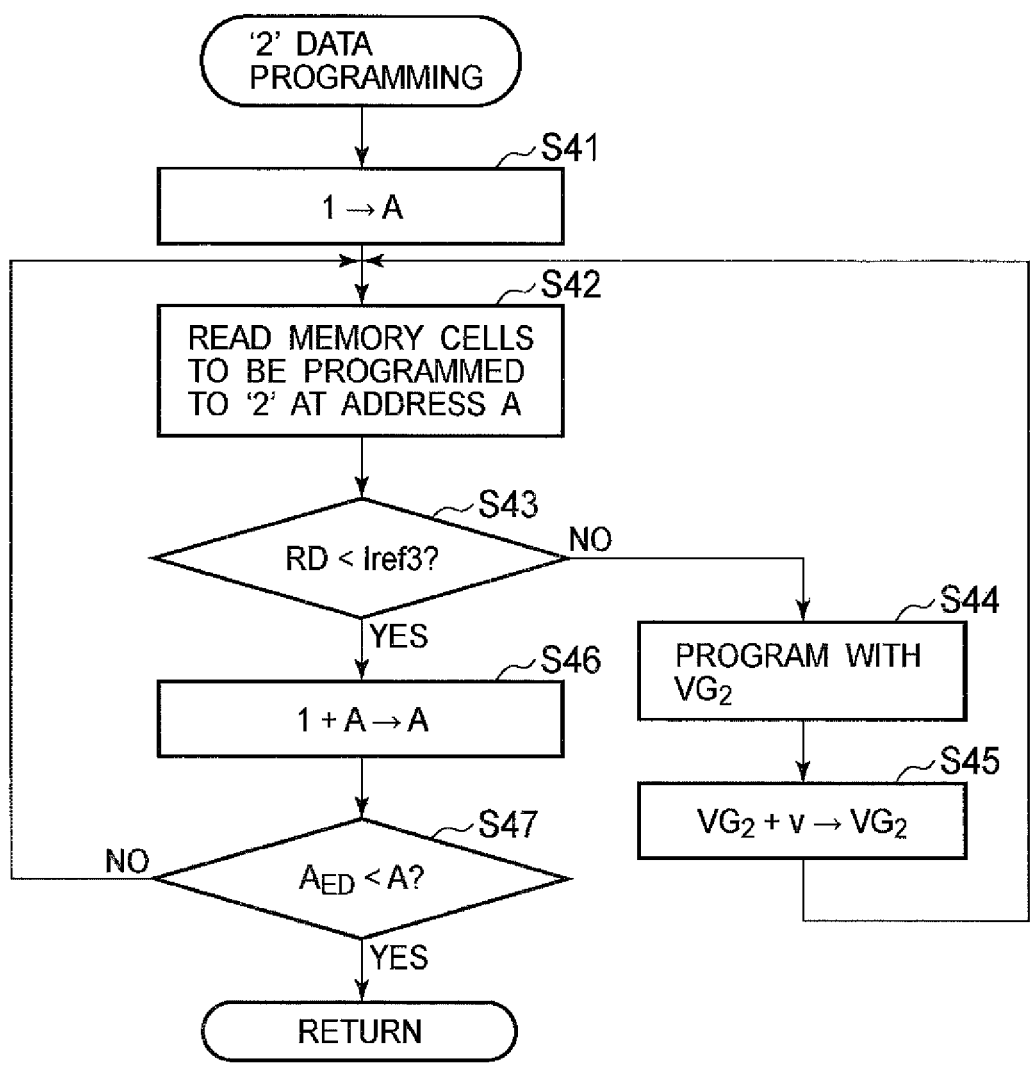

First, the controller 108 stores '1' as an initial address A in its access address register (step S41 in FIG. 8).

Next, the controller 108 supplies the row and column decoders 104, 106 with control signals for reading data from the charge traps 30, 32 in row A that are to be programmed with '2' data (step S42). This step is similar to step S22 in the '0' data programming procedure, using the same scan voltage VS and read voltage VR.

Next, in step S43, the controller 108 decides whether all the read currents RD obtained in step S42 from charge traps to be programmed to '2' are less than the threshold current Iref3 shown in FIG. 5 for distinguishing between '2' and '3' data.

When it is decided in step S43 that one or more of the charge traps to be programmed to '2' in row A require further charge injection because the read current RD they produced in step S42 is equal to or greater than Iref3, the controller 108 proceeds to step S44. In step S44, the controller 108 sends the row and column decoders 104, 106 control signals to execute a programming operation on the charge traps now requiring charge injection in row A. The row decoder 104 applies a preset gate voltage $VG_2$, which is lower than the gate voltage $VG_1$ used for programming '1' data, to the word line WL at address A. The column decoder 106 applies the write voltage VW and ground potential (0 volts) to the bit lines BL to inject charge into the necessary charge traps as described in step S24 of the '0' data programming procedure.

After executing step S44, the controller 108 adds a voltage increment v to the programming voltage $VG_2$ and sets the resulting value as a new programming voltage $VG_2$ (step S45), then returns to step S42 and repeats the above process.

Steps S42 to S45 form a loop that programs the charge traps 30, 32 that are to be programmed to '2'. The programming proceeds in stepwise increments, with gradually increasing programming voltages $VG_2$, until all these charge traps 30, 32 produce read currents RD less than threshold Iref3, that is, until the data value '2' is actually stored in all these charge traps.

When the controller 108 decides in step S43 that all the read currents RD produced by charge traps that are to be programmed to '2' are less than threshold value Iref3, it increments the access address A by one (step S46) and returns to step S42 unless the new access address A is greater than the end address $A_{ED}$ (step S47). Steps S42 to S47 are iterated until the access address A exceeds the end address $A_{ED}$ in step S47, at which point the '2' programming routine is finished.

Execution of the '2' programming routine brings all the charge traps 30, 32 that are to be programmed with '2' data into states that produce read currents lower than the threshold Iref2 for distinguishing between '2' and '3' data. The distribution of read currents produced by these charge traps is thereby shifted from the distribution indicated by line B3 in FIG. 5 to the distribution indicated by line B2, located between the threshold Iref3 for distinguishing between '2' and '3' data and the threshold Iref2 for distinguishing between '1' and '2' data.

Since distribution B3 is comparatively narrow, all of these charge traps can be programmed to '2' in substantially the same number of iterations of steps S42 to S45. If the charge traps had been left with their original distribution AP, some charge traps would require more iterations.

After executing the data '2' programming routine (step S4), the controller 108 terminates the data programming procedure shown in FIG. 3.

As described above, before the programming of data values '0' to '2', an initialization programming operation (step S1) is carried out to ensure that the charge traps 30, 32 in all the memory cells 10 produce initial read currents less than the initialization threshold current Iref4. This operation ensures that all the charge traps have at least the initial minimum charge $Q_{MIN}$, and that the distribution of their initial read currents is comparatively narrow, resembling distribution B3 in FIG. 5 instead of the comparatively wide distribution AP. Accordingly, in the '0', '1', and '2' programming operations (steps S2 to S4), no charge traps require an inordinately large number of programming iterations. The number of programming cycles necessary to complete the programming of all charge traps is therefore reduced as compared with the case where no initialization programming operation is performed.

Figure 9:
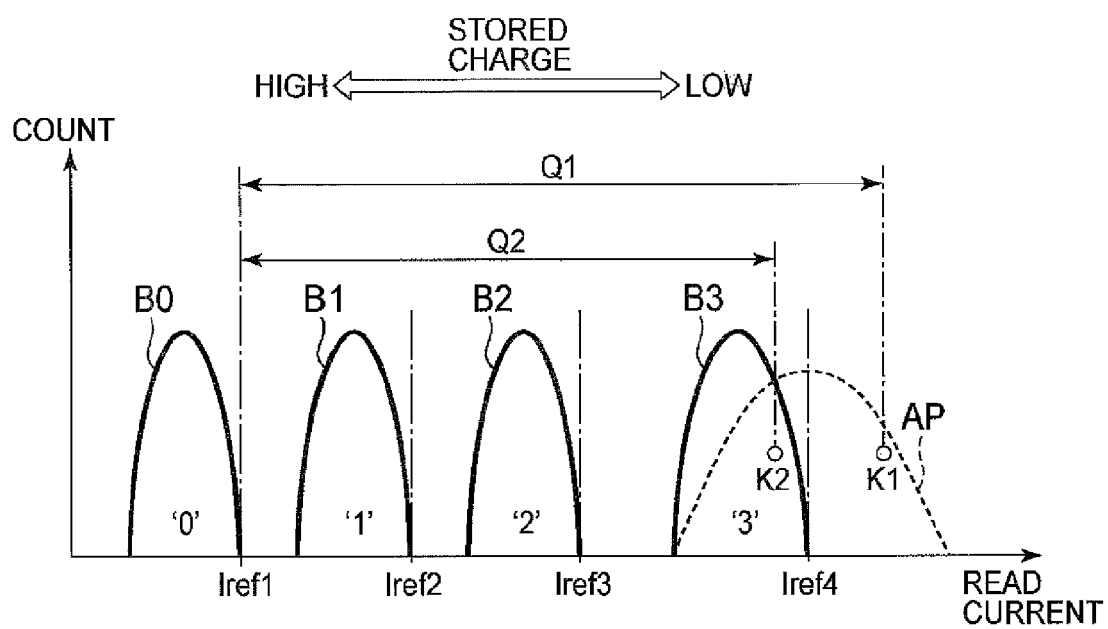
FIG. 9 is a histogram similar to FIG. 5, illustrating the effect of initialization.

For example, FIG. 9 shows a case in which a charge trap originally produces a read current K1 higher than threshold Iref4 is to be programmed to the '0' state. Without the initialization programming operation, the amount of charge that must be injected into this charge trap is Q1. If the initialization programming operation is performed, reducing the initial read current of this charge trap to a value K2 lower than threshold Iref4, then in the '0' programming step, it only becomes necessary to inject an amount of charge Q2 less than Q1. Charge Q2 can be injected in fewer programming cycles than charge Q1.

When a charge trap in a memory cell 10 is programmed, the main effect is to reduce the read current produced by that charge trap, but there is also a slight reduction in the read current produced by the other charge trap in the same memory cell (the mirror charge trap). This is because, while the read current is mainly determined by the amount of charge stored in the charge trap on the source side of the memory cell, the read current is also slightly affected by the amount of charge stored in the charge trap on the drain side.

In the present embodiment, the '0' programming step does not affect the read currents of '1' and '2' data because the '0' programming step is concluded before the programming of '1' and '2' data.

Although the '0', '1', and '2' programming steps may lower the read currents of '3' data, the comparatively wide programming window between distribution B3 and distribution B2 in FIG. 5 ensures that '3' data will not be mistakenly read as '2' data.

The '1' and '2' programming steps may lower the read currents of the '0' data programmed in the '0' programming step, but this simply moves the read currents further below threshold Iref1. The '0' data will still be read as '0'.

The '2' programming step may lower the read currents of the '1' data stored in the '1' programming step, but the amount of current injected in the '2' programming step is comparatively small, so the effect on the '1' read currents is slight and even the comparatively narrow programming window between the B0 and B1 distributions in FIG. 5 is sufficient to ensure that '1' data will not be mistakenly read as '0' data.

In addition, the narrowing of the initial read current distribution from AP to B3 in FIG. 5 limits the effect of the programming of one charge trap on the read current of the mirror charge trap by limiting the amount of programming charge that needs to be injected.

The present embodiment therefore both shortens the programming process and improves the reliability of the programmed data.

Although the initialization programming step requires additional time, this step can be completed fairly quickly because each pair of charge traps adjacent to the same bit line in the same row can be read and programmed together.

Although the present embodiment uses a programming procedure that proceeds from '0' to '1' and then to '2' data, the invention is also applicable to other programming procedures.

For example, the novel initialization programming step can be advantageously applied to the programming procedure taught by Yuda, in which the two charge traps in the same memory cell are programmed alternately. The narrowed initial read current distribution B3 helps ensure that both charge traps are programmed in substantially the same number of program-verify cycles, thereby minimizing the effect of the programming of one of the charge traps on the programming of the mirror charge trap.

Figure 10:
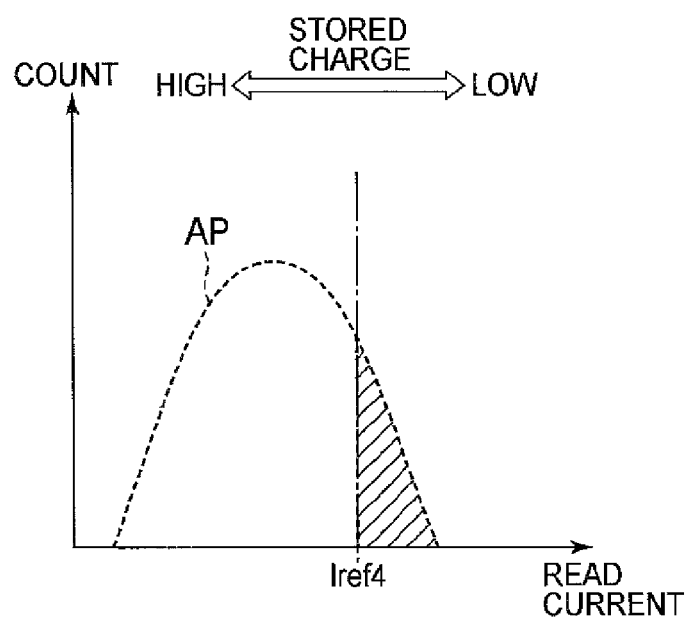
FIG. 10 is a histogram showing an alternative positioning of the initialization threshold current relative to the distribution of read currents before initialization.

In a variation of the initialization programming procedure, step S12 is carried out with a reduced scan voltage VS. This has the effect of raising the initialization threshold current Iref4 as shown in FIG. 10, so that additional charge is injected only into charge traps with very high read currents and thus very low original levels of charge. The total number of charge traps requiring initialization programming is thereby reduced from the shaded area in FIG. 5 to the shaded area in FIG. 10, and the initialization procedure is shortened accordingly.

Alternatively, the initialization programming procedure may be carried out with an increased scan voltage VS to lower the initialization threshold current, so that the resulting initial distribution of read currents and stored charge is narrower. The distributions of read currents and stored charge in programmed memory cells will then also be narrowed, resulting in more reliable reading of the stored data.

In another variation, the initialization programming step is carried out by reading and injecting charge into individual charge traps, as in the data programming steps. This also assures more accurate initialization and more reliable reading of programmed data.

In this variation, it is possible to initialize the charge traps that are to be programmed to '0' just before they are programmed, then initialize the charge traps that are to be programmed to '1' just before they are programmed, and then initialize the charge traps that are to be programmed to '2' just before they are programmed. The charge traps that store '3' data need not be initialized.

The invention is not limited to nonvolatile memory devices that store four-valued data in each charge trap. The initialization programming step is useful in nonvolatile memory devices that store any number of data values per charge trap, including two-valued (bi-level) data, three-valued data, and data with five values or more.

The data reading operations (steps S12 to S15, S22 to S25, S32 to S35, and S42 to S45), which are based on read current drawn through bit lines BL in the above embodiment, may be based on the voltages on the bit line BL instead. The threshold currents Iref1 to Iref4I are then replaced by corresponding threshold voltages, which are generated by respective voltage sources.

The purpose of step S13 in FIG. 4 is to decide which charge traps have less than the initial minimum charge ($Q_{MIN}$), and it does not matter whether this is done by testing read currents or voltages or by some other means.

Those skilled in the art will recognize that further variations are possible within the scope of the invention, which is defined in the appended claims.

What is claimed is:

1. A nonvolatile semiconductor memory device comprising:
   a plurality of bit lines;
   a plurality of memory cells connected to the bit lines, the memory cells including respective charge traps for storing charge representing data values; and
   a controller for programming the memory cells by injecting charge into their charge traps via the bit lines, and reading the memory cells by detecting the charge stored in their charge traps; wherein
   before programming data into the memory cells, the controller places the memory cells in an initial state by reading the memory cells to determine which charge traps hold less than a predetermined minimum charge and injecting charge into the charge traps holding less than the predetermined minimum charge until all of the charge traps hold at least the predetermined minimum charge.

2. The nonvolatile semiconductor memory device of claim 1, wherein the controller detects the charge stored in the charge traps by drawing read current through the memory cells via the bit lines.

3. The nonvolatile semiconductor memory device of claim 2, wherein the controller determines which charge traps hold less than the predetermined minimum charge by comparing the read current drawn through the memory cells with an initialization threshold current, and injects charge into the charge traps holding less than the predetermined minimum charge until the read current drawn on each one of the bit lines is less than the initialization threshold current.

4. The nonvolatile semiconductor memory device of claim 3, wherein:
   the bit lines are numbered by consecutive integers;
   each one of the memory cells is connected to two consecutively numbered ones of the bit lines; and to determine which charge traps hold less than the predetermined minimum charge, the controller applies a first potential to the odd-numbered bit lines and a second potential to the even-numbered bit lines and compares the read current on the odd-numbered bit lines with the initialization threshold current, then applies the first potential to the even-numbered bit lines and the second potential to the odd-numbered bit lines and compares the read current on the even-numbered bit lines with the initialization threshold current.

5. The nonvolatile semiconductor memory device of claim 4, wherein, when the read current on one of the bit lines is greater than the initialization threshold current, the controller injects charge into a pair of the charge traps disposed in different ones of the memory cells connected to said one of the bit lines by applying a third potential to said one of the bit lines and applying the first potential to a pair of bit lines numbered consecutively with said one of the bit lines.

6. The nonvolatile semiconductor memory device of claim 3, wherein:
in the initial state, all of the charge traps hold charge representing a first data value; and
the controller programs a second data value into a first set of the charge traps by drawing the read current through the memory cells including the charge traps in the first set and injecting charge into the charge traps in the first set until the read current is less than a first data threshold current, the first data threshold current being less than the initialization threshold current.

7. The nonvolatile semiconductor memory of claim 6, wherein the controller programs a third data value into a second set of the charge traps by drawing the read current through the memory cells including the charge traps in the second set and injecting charge into the charge traps in the second set until the read current is less than a second data threshold current, the second data threshold current being greater than the first data threshold current and less than the initialization threshold current.

8. The nonvolatile semiconductor memory of claim 7, wherein the first set of the charge traps and the second set of the charge traps are mutually exclusive.

9. A method of programming a nonvolatile semiconductor memory device including a plurality of bit lines and a plurality of memory cells connected to the bit lines, the memory cells including respective charge traps for storing charge representing data values, the method comprising:
reading the memory cells to determine which charge traps hold less than a predetermined minimum charge;
injecting charge into the charge traps holding less than the predetermined minimum charge until all of the charge traps hold at least the predetermined minimum charge, thereby placing the memory cells in an initial state; and
programming the memory cells by selectively injecting charge into their charge traps via the bit lines after the memory cells have been placed in the initial state.

10. The method of claim 9, wherein reading the memory cells further comprises drawing read current through the memory cells via the bit lines.

11. The method claim 10, wherein:
determining which charge traps hold less than the predetermined minimum charge further comprises comparing the read current drawn through the memory cells with an initialization threshold current; and
injecting charge into the charge traps holding less than the predetermined minimum charge further comprises injecting charge into the charge traps holding less than the predetermined minimum charge until the read current drawn on each one of the bit lines is less than the initialization threshold current.

12. The method of claim 11, wherein the bit lines are numbered by consecutive integers, each one of the memory cells is connected to two consecutively numbered ones of the bit lines, and determining which charge traps hold less than the predetermined minimum charge further comprises:
applying a first potential to the odd-numbered bit lines and a second potential to the even-numbered bit lines and comparing the read current on the odd-numbered bit lines with the initialization threshold current; and
applying the first potential to the even-numbered bit lines and the second potential to the odd-numbered bit lines and comparing the read current on the even-numbered bit lines with the initialization threshold current.

13. The method of claim 12, wherein injecting charge into the charge traps holding less than the predetermined minimum charge further comprises injecting charge into a pair of the charge traps disposed in different ones of the memory cells connected to one of the bit lines on which the read current is greater than the initialization threshold current by applying a third potential to said one of the bit lines and applying the first potential to a pair of bit lines numbered consecutively with said one of the bit lines.

14. The method of claim 11, wherein in the initial state all of the charge traps hold charge representing a first data value, and programming the memory cells further comprises programming a second data value into a first set of the charge traps by:
drawing the read current through the memory cells including the charge traps in the first set; and
injecting charge into the charge traps in the first set until the read current is less than a first data threshold current;
the first data threshold current being less than the initialization threshold current.

15. The method of claim 14, wherein programming the memory cells further comprises programming a third data value into a second set of the charge traps by:
drawing the read current through the memory cells including the charge traps in the second set;
and injecting charge into the charge traps in the second set until the read current is less than a second data threshold current;
the second data threshold current being greater than the first data threshold current and less than the initialization threshold current.

16. The method of claim 15, wherein the first set of the charge traps and the second set of the charge traps are mutually exclusive.

* * * * *